United States Patent
Kaneko et al.

[11] Patent Number: 6,140,805
[45] Date of Patent: Oct. 31, 2000

[54] SOURCE FOLLOWER NMOS VOLTAGE REGULATOR WITH PMOS SWITCHING ELEMENT

[75] Inventors: Tetsuya Kaneko; Junichi Okamura, both of Yokohama, Japan

[73] Assignee: Kabushiki Kaisha Toshiba, Kawasaki, Japan

[21] Appl. No.: 09/313,274

[22] Filed: May 18, 1999

[51] Int. Cl.[7] .................................................. G05F 1/56
[52] U.S. Cl. ......................... 323/280; 323/282; 323/265; 365/226
[58] Field of Search ................................. 323/280, 282, 323/265; 365/226

[56] References Cited

U.S. PATENT DOCUMENTS

| | | |
|---|---|---|
| 4,964,084 | 10/1990 | Jung et al. . |
| 5,249,155 | 9/1993 | Arimoto et al. . |
| 5,309,399 | 5/1994 | Murotani . |
| 5,369,317 | 11/1994 | Casper et al. . |
| 5,376,832 | 12/1994 | Gariboldi et al. . |
| 5,398,207 | 3/1995 | Tsuchida et al. . |
| 5,402,375 | 3/1995 | Horiguchi et al. . |
| 5,508,971 | 4/1996 | Cernea et al. . |
| 5,552,739 | 9/1996 | Keeth et al. ............................. 327/538 |
| 5,563,825 | 10/1996 | Cernea et al. . |
| 5,592,420 | 1/1997 | Cernea et al. . |
| 5,612,920 | 3/1997 | Tomishima . |
| 5,629,609 | 5/1997 | Nguyen et al. ........................ 323/269 |
| 5,646,516 | 7/1997 | Tobita . |
| 5,673,232 | 9/1997 | Furutani ................................. 365/226 |
| 6,009,022 | 12/1999 | Lee et al. ............................ 365/189.09 |

*Primary Examiner*—Viet Q. Nguyen
*Attorney, Agent, or Firm*—Banner & Witcoff, Ltd.

[57] ABSTRACT

A voltage generator for generating an output voltage at an output terminal thereof which includes a first transistor of a first channel conductivity type having a first end connected to the output terminal and a feedback regulator connected to the output terminal. A switch is connected between a voltage node and a second end of the first transistor, the switch receiving a switching signal.

12 Claims, 8 Drawing Sheets

WITHOUT PMOS SW

WITH PMOS SW

CONTROL SIGNAL OF PMOS SW

SOURCE FOLLOWER NMOS VOLTAGE REGULATOR WITH PMOS SWITCHING ELEMENT

TECHNICAL FIELD

The present invention generally relates to a voltage generator and, more particularly, to a voltage generator for a semiconductor device such as a semiconductor memory device.

BACKGROUND OF THE INVENTION

FIG. 1 shows an arrangement of a sense amplifier circuit 1 for amplifying a potential difference on bit lines BL and /BL. Memory cells (not shown) such as dynamic random access memory (DRAM) cells are connected to the bit lines. Sense amplifier circuit 1 includes P-channel MOS transistors 2 and 3 and N-channel MOS transistors 4 and 5. P-channel MOS transistor 2 has a gate connected to bit line/BL and a first end connected to bit line BL. P-channel MOS transistor 3 has a gate connected to bit line BL and a first end connected to bit line/BL. The second ends of P-channel MOS transistors 2 and 3 are connected together to a drive signal line 7, which is selectively supplied with a sense amplifier drive signal SAP. N-channel MOS transistor 4 has a gate connected to bit line/BL and a first end connected to bit line BL. N-channel MOS transistor 5 has a gate connected to bit line BL and a first end connected to bit line/BL. The second ends of N-channel MOS transistors 4 and 5 are connected to a drive signal line 8 which is selectively supplied with a sense amplifier drive signal/SAN. FIG. 1 further shows a PMOS driver transistor 6 having a first end connected to drive signal line 7 and a second end connected to a VBLH (voltage bit line high) generator. The gate of PMOS driver transistor 6 is supplied with a switching signal for turning PMOS driver transistor 6 to supply the sense amplifier drive signal SAP to the second ends of P-channel MOS transistors 2 and 3.

FIG. 2 shows a conventional PMOS voltage generator 10 which may be used as the VBLH generator of FIG. 1. PMOS voltage generator 10 includes a comparator 12, a P-channel MOS transistor 14, a first resistive element 16, and a second resistive element 18. P-channel MOS transistor 14, resistive element 16, and resistive element 18 are connected in series between a first voltage VCC (e.g., 3.3 volts) and a second voltage VSS (e.g., ground). The output terminal of PMOS voltage generator 10 is a node between P-channel MOS transistor 14 and resistive element 16. The output voltage VBLH may be, for example, 1.8 volts. One input terminal of comparator 12 is connected to a reference voltage and the other input terminal of comparator 12 is connected to a feedback voltage derived from a node between first and second resistive elements 16 and 18.

However, the feedback operation of PMOS voltage generator 10 of FIG. 2 is relatively slow and it is difficult for PMOS voltage generator 10 to satisfy peak current demands. In order to overcome this problem, a so-called "active-kicker" may be provided as shown in FIG. 3. Specifically, the active kicker is a P-channel MOS transistor 20 connected between the voltage VCC and the output terminal of the PMOS voltage generator 10. This active kicker is switched ON to provide a larger current and thereby enhance the response of the voltage generator. However, the active kicker causes noise problems. In addition, since the current IBLH (current bit line high) depends on various factors such as the data pattern of the data stored in the memory cells to which the bit lines are connected, the memory cell capacitance, and the bit line capacitance, it is difficult to provide the appropriate current IBLH.

FIG. 4 shows a conventional NMOS source follower type voltage generator 40. Voltage generator 40 includes a VppA generator 32 and an N-channel MOS driver transistor 34. Examples of circuits which may be utilized as VppA generator 32 are shown in FIGS. 5(a) and 5(b). N-channel MOS driver transistor 34 has a first end connected to a first voltage VCC (e.g., 3.3 volts) and a gate supplied with the output voltage of VppA generator 32 (e.g., about 2.3 volts). N-channel MOS driver transistor 34 is a relatively large transistor having, for example, a total channel width of about 74 millimeters and a channel length of about 0.36 micrometers. A VBLH voltage of 1.8 volts is output from voltage generator 40. Voltage generator 40 of FIG. 4 is advantageous in that it is responsive to rapid variations of load current. However, as can be seen with reference to FIG. 7(a), the sub-threshold current of the N-channel MOS driver transistor 34 gradually raises the output voltage VBLH during a pre-charge cycle (including a stand-by condition) and a low-frequency operation condition. The degree of this "voltage creep" depends on the characteristics of the N-channel MOS driver transistor, but such creep could adversely affect restore levels or sensing margin.

One solution to this voltage creep is to utilize a current bleeder circuit 36 as shown in FIG. 6. Bleeder circuit 36 bleeds the sub-threshold current of the N-channel MOS driver transistor 34 so that voltage creep may be eliminated as can be seen with reference to FIG. 7(b). In general, subthreshold leakage does not depend on the active/stand-by state of the device. To suppress the voltage creep completely, a large bleeder current is needed even when the device is in a stand-by state. However, a bleeder circuit wastes current. For example, the bleeder currents in the active and stand-by states are 2 milliamps and 1 microamp, respectively, in for example a 64 MB DRAM. If the size of the NMOS driver transistor is increased to provide for a larger current IBLH and to thereby improve response, the bleeder current becomes even larger. In the case of a 256 MB DRAM, the size of the NMOS driver transistor becomes four times larger than that of the 64 MB DRAM. So the resulting bleeder current becomes four times larger than that found in the 64 MB DRAM. In addition, if the actual sub-threshold leakage current is different than the design value (due to, for example, process variations), current compensation can become difficult and the characteristics of VBLH may be adversely affected.

Because of the connection to the bit lines, the IBLH can be a very large and spiky current, particularly in the case of highly integrated semiconductor memory devices such as 256 Mbit DRAM devices. Accordingly, the construction and operation of the VBLH generator is a very important design consideration for highly integrated semiconductor memory devices. While the above-described arrangements might be effectively adapted for use in semiconductor memory devices such as 16 MB DRAMs, the current requirements for highly integrated semiconductor memory devices such as 256 MB DRAMs make use of VBLH generators such as those described above problematic.

SUMMARY OF THE INVENTION

In accordance with one aspect of the present invention, a voltage generator for generating an output voltage at an output terminal thereof includes a first transistor of a first channel conductivity type having a first end connected to the output terminal and a feedback regulator connected to the output terminal. A switch is connected between a voltage node and a second end of the first transistor, the switch receiving a switching signal.

In accordance with another aspect of the present invention, a semiconductor memory device includes memory cells connected to bit lines and sense amplifiers for amplifying potential differences on the bit lines. A voltage generator generates a voltage at an output terminal thereof which is supplied to the sense amplifiers. The voltage generator includes a first transistor of a first channel conductivity type having a first end connected to the output terminal and a feedback regulator connected to the output terminal. A switch is connected between a voltage node and a second end of the first transistor, the switch receiving a switching signal.

The voltage generator described above makes the voltage rise due to sub-threshold leakage during stand-by, precharging, and/or a low frequency operation very small. Thus, voltage creep is significantly reduced and a stable voltage may be provided by the voltage generator. In addition, the waste current becomes smaller than in the conventional bleeder scheme. Still further, the first transistor can have a low threshold voltage and thus a non-boosted voltage may be supplied to the gate of the first transistor.

BRIEF DESCRIPTION OF THE DRAWINGS

The accompanying drawings, which are incorporated in and constitute a part of the specification, illustrate various embodiments of the present invention and, together with the general description given above and the detailed description provided below, serve to explain the principles of the invention.

FIGS. 13(a)–13(c) are graphs of simulation results.

DETAILED DESCRIPTION

Figure 1:
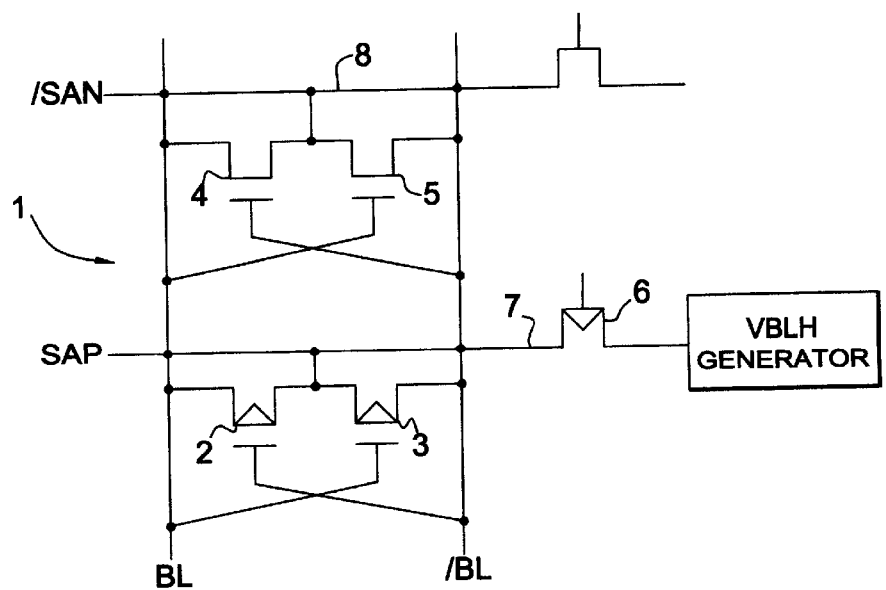
FIG. 1 shows a sense amplifier circuit.
Figure 2:
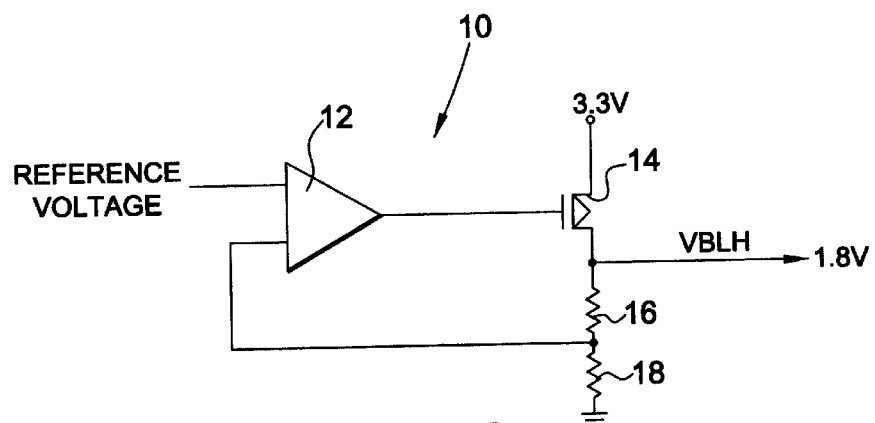
FIG. 2 shows a first type of voltage generator.
Figure 3:
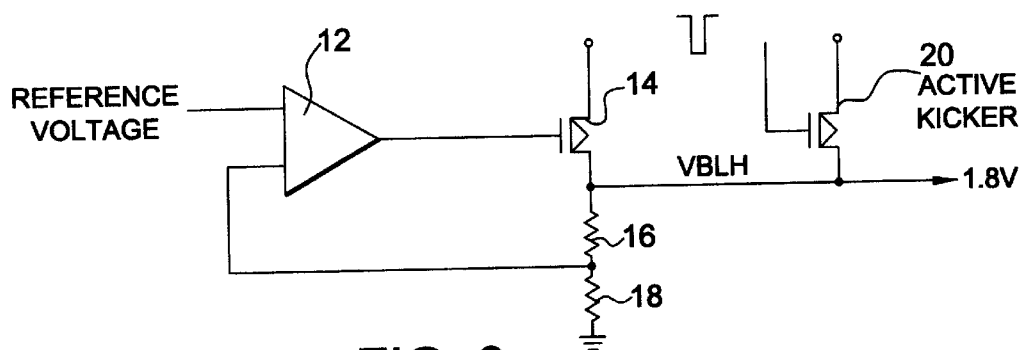
FIG. 3 shows the voltage generator of FIG. 2 modified to include an active kicker.
Figure 4:
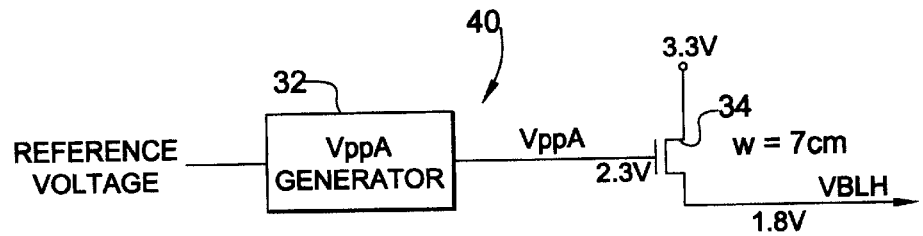
FIG. 4 shows a second type of voltage generator.
Figure 5A:
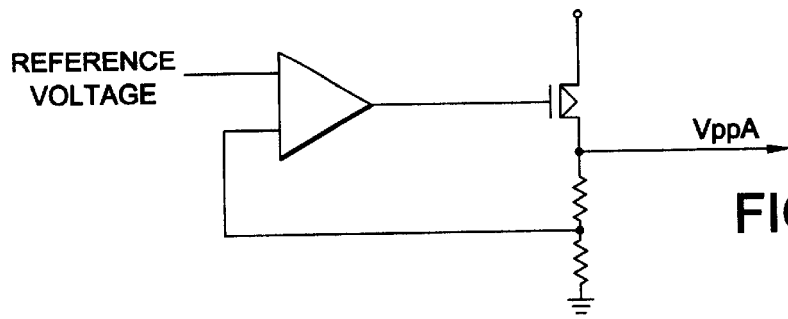
FIGS. 5(a) and 5(b) show VppA voltage generating circuits usable in the type of voltage generator shown in FIG. 4.
Figure 5B:
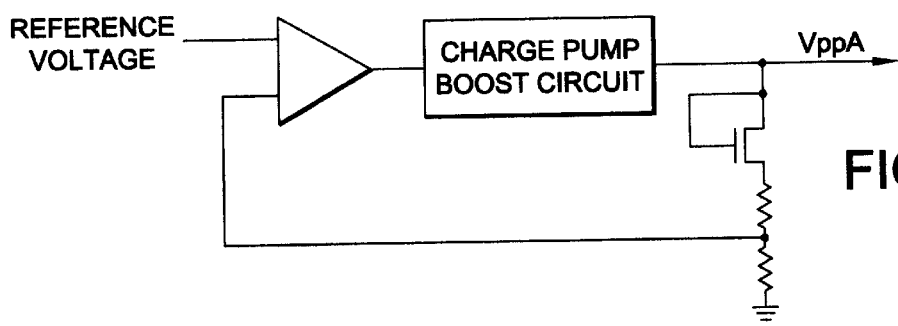
Figure 6:
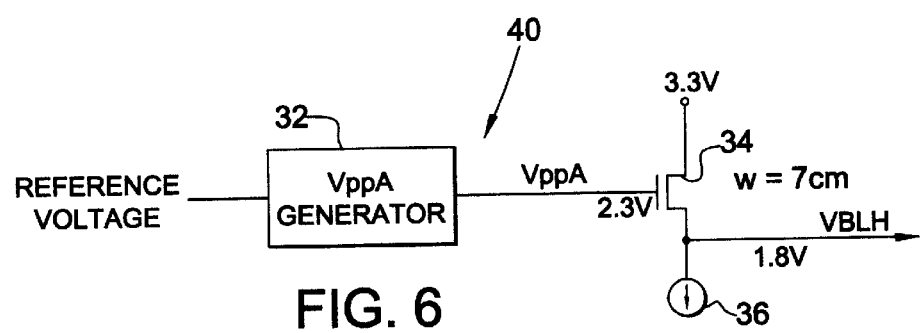
FIG. 6 shows the voltage generator of FIG. 4 modified to include a bleeder circuit.
Figure 7A:
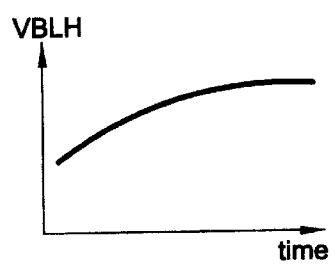
FIGS. 7(a) and 7(b) are graphs illustrating the relationship of the voltage VBLH and time for the voltage generators of FIGS. 4 and 6, respectively.
Figure 7B:
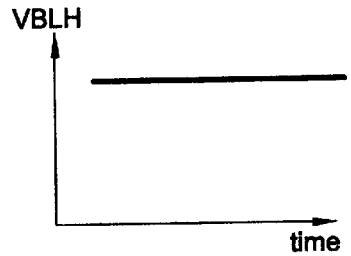
Figure 8:
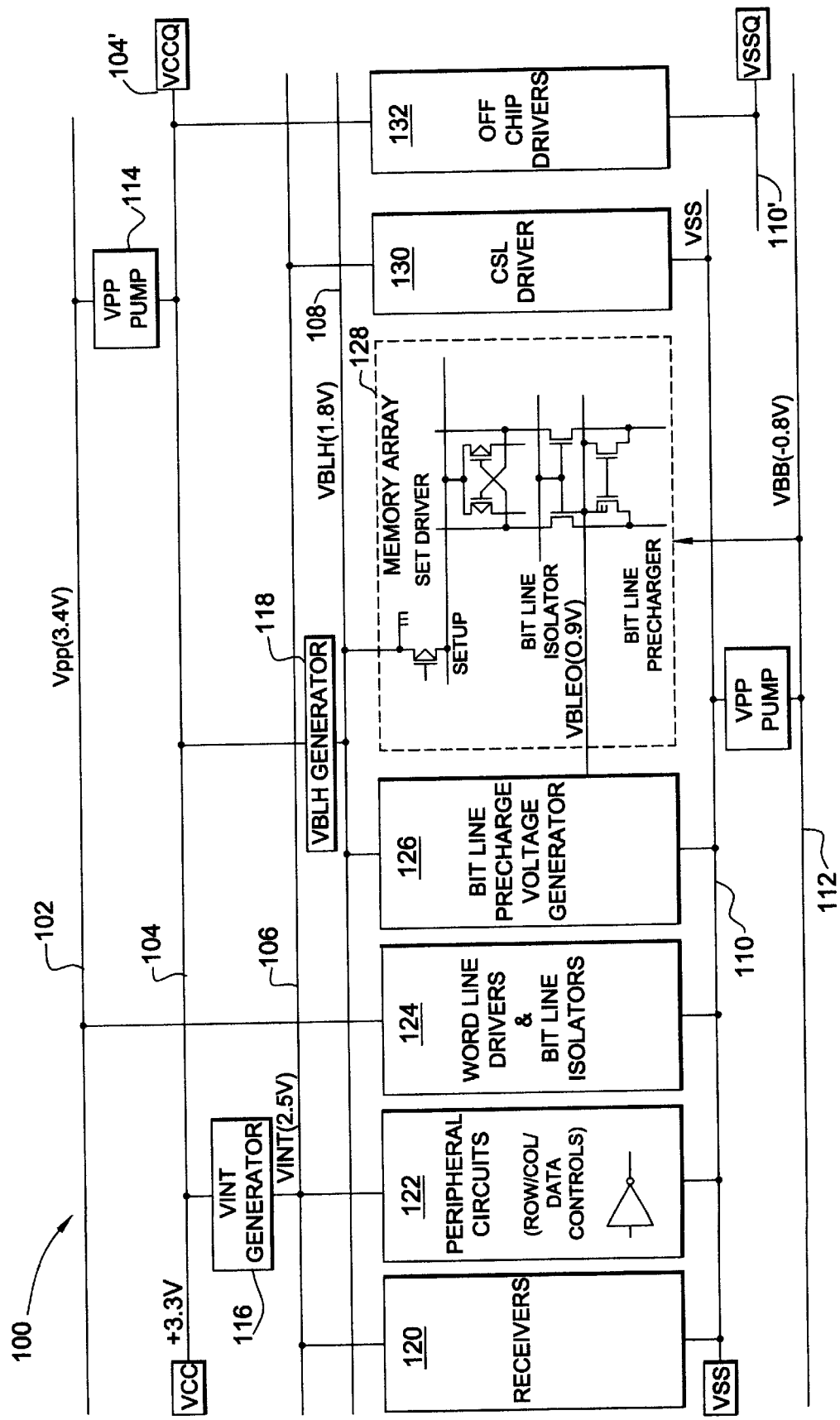
FIG. 8 is a schematic block diagram of a power supply system for a semiconductor memory device.

FIG. 8 is a schematic block diagram of a power system 100 for a semiconductor memory device in which the voltage generator of the present invention may be implemented. Power system 100 includes VPP power line 102, VCC power line 104, VINT power line 106, VBLH power line 108, VSS power line 110, and VBB power line 112. A VPP pump circuit 114 boosts the voltage VCC (e.g., about +3.3 volts) to about 3.4 volts. VPP at 3.4 volts is assured even when VCC may drop to 2.8 volts. A VINT generator 116 uses the voltage VCC to generate an internal voltage VINT of about 2.5 volts. A VBLH generator 118 uses the voltage VCC to generate a VBLH voltage of about 1.8 volts. A VBB pump circuit uses the voltage VSS to generate a VCC voltage of about –0.8 volts. The elements of the semiconductor memory device are appropriately connected to these various power lines. For example, receivers 120 and peripheral circuits 122 (such as row decoders, column decoders and the like) are connected between VINT power line 106 and VSS power line 110. Receivers 120 may include circuits used to detect input signal line changes, signals including, for example, /RAS, /CAS, /WE, CKE, CLK, ADDRESS, and other related signals. Word line drivers and bit line isolator circuits 124 are connected between VPP power line 102 and VSS power line 110. Bit line precharge voltage generator 126 is connected between VBLH power line 108 and VSS power line 110. Column select line driver circuit (CSL driver) 130 is connected between VINT power line 106 and VSS power line 110. Memory cell array 128 is connected between various voltage levels including VBLH power line 108 (through a secondary sense amp, not shown), VBB power line 112 (for the well bias voltage), VPP power line 102 (connected to gates of transfer transistors), and VPL power line (not shown, connected to the capacitor cells, as the plate voltage). Off-chip driver circuits 132 are connected between VCCQ power line 104' and VSSQ power line 110'.

Memory cell array 128 includes memory cells (not shown in FIG. 8). The memory cells of memory cell array 128 are DRAM cells and more particularly are trench capacitor DRAM cells as described in the article by Nesbit et al. entitled "A 0.6 $\mu m^2$ 256 Mb Trench DRAM Cell With Self-Aligned BuriEd Strap (BEST)", IEDM Digest of Technical Papers, December 1993, pp. 627–620, the contents of which are incorporated in their entirety herein by reference. One advantage to using this application in trench capacitor memories is that the trench provides additional decoupling for the VBLH. The structure defined herein is also useful in stacked capacitor memory cell configurations. In the stacked capacitor memory cells, bit line capacitance may be larger than the trench capacitor memory cell and the load current of VBLH in stacked cell memory may become larger than that in trench cell memories. To supply these high peak currents, the system described herein is useful as well. Likewise, this invention is applicable to SRAMs, Non-Volatile memories, and FRAMs.

Figure 9:
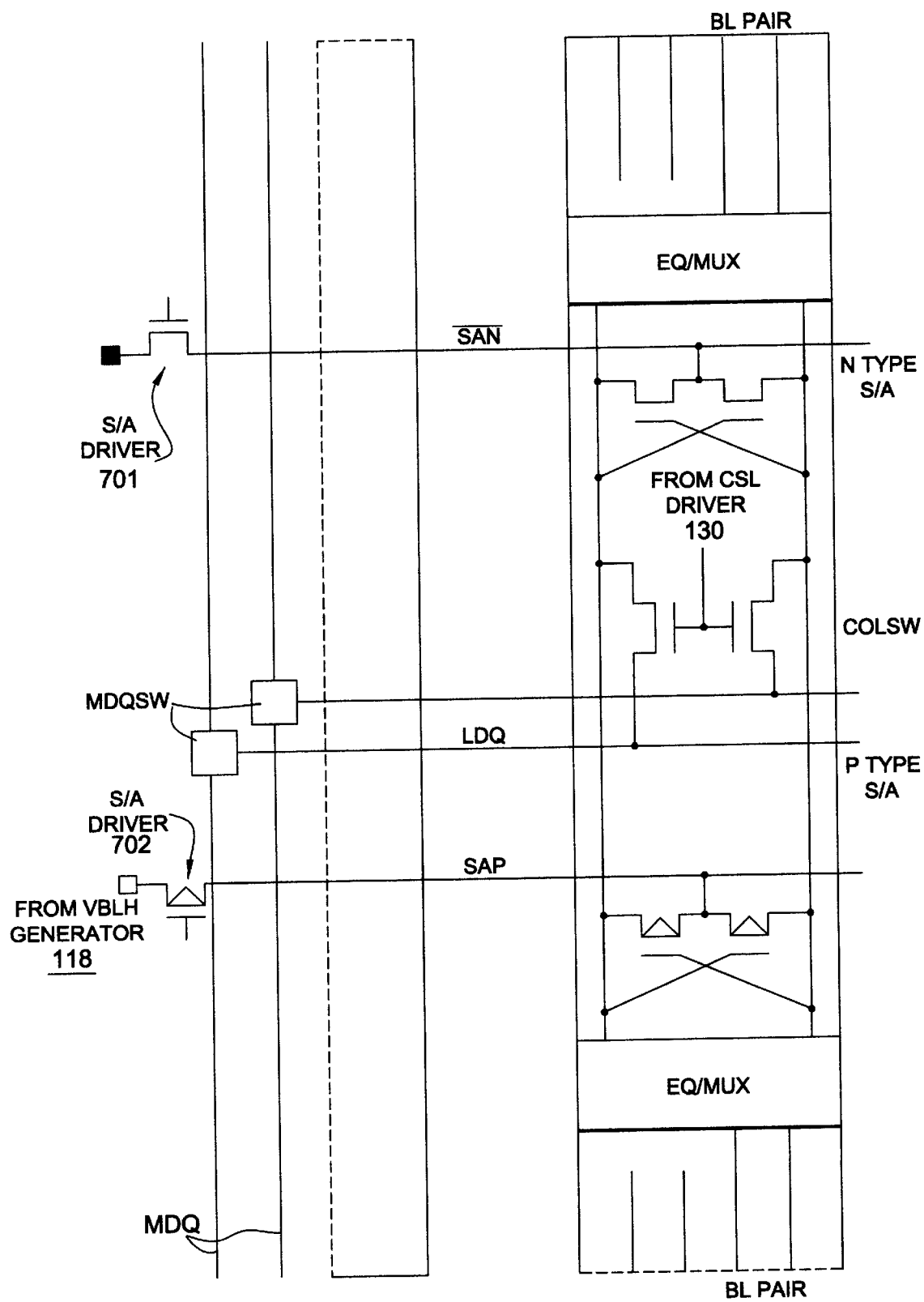
FIG. 9 is a circuit schematic of a two-sided shared sense amplifier.

FIG. 9 is a circuit schematic showing a portion of the memory cell array 128. FIG. 9 shows a two-sided shared sense amplifier and master data bus switch MDQSW connecting local data line LDQ to master data line MDQ. Local data line LDQ depicted in FIG. 9 is a single line having complementary signal carrying wires. Similarly, master data line MDQ is a single line having complementary signal carrying wires. Master data line switch MDQSW includes two switches, preferably MOS type transistor switches, connecting the respective complementary wires of local data line LDQ to the wires of master data line MDQ.

Figure 10:
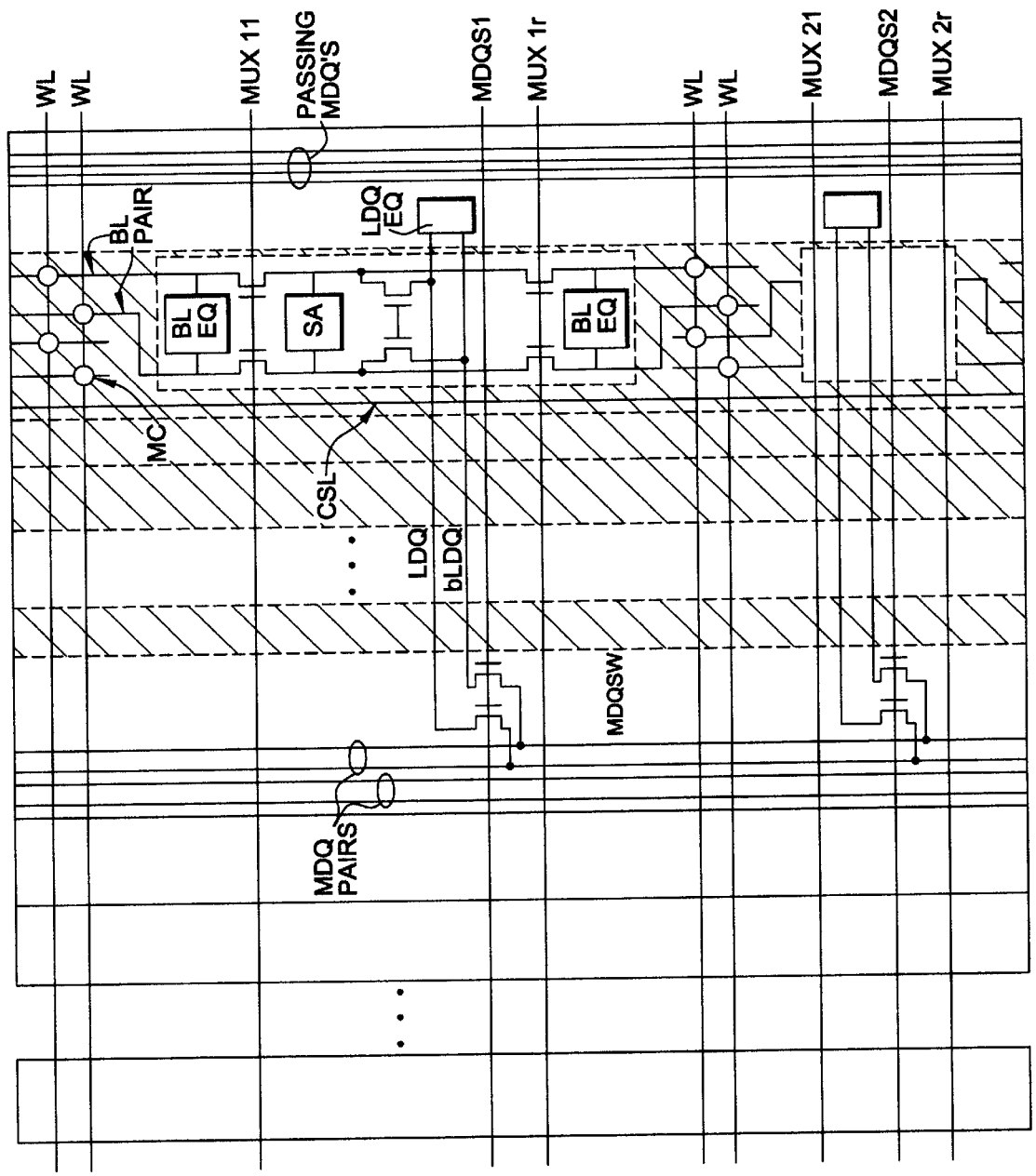
FIG. 10 is a more detailed circuit schematic of the components shown in FIG. 9.

The sense amplifier includes an N-type sense amplifier portion and a P-type sense amplifier portion. The N-type sense amplifier portion is controlled by a signal/SAN driven by a first S/A driver 701 and the P-type sense amplifier portion is controlled by a signal SAP driven by a second S/A driver 702. The output of VBLH generator 118 is supplied to second S/A driver 702. Together, the N- and P-type sense amplifier portions form a latching sense amplifier circuit. The signals latched in the sense amplifier may be transferred to local data line LDQ through column select switch COLSW. Column select switch COLSW is controlled by a column select signal CSL which is generated by CSL driver circuit 130. The latching sense amplifier is connected to bit line pairs through one of two equalizer/multiplexer (EQ/MUX) circuits, each disposed adjacent to the N-type sense amplifier portion and the P-type sense amplifier portion, respectively. The bit line isolator and bit line precharge circuits of FIG. 8 correspond to the multiplexer and equalizer circuits of FIG. 10, respectively. The multiplexer portion of this circuit may include a pair of switching transistors, each connected in series in each of the two complementary signal lines as shown in FIG. 10. In FIG. 10, a first multiplexer is controlled by signal MUXil and a second multiplexer is controlled by a signal MUXir. In FIG. 10, the bit line equalizer is shown functionally as a block shunting across the two complementary bit lines of a bit line pair. Conventionally, such a bit line equalizer may be a single shunting switch transistor or a pair of shunting transistors connected in series to shunt across the wires of the bit line pair. Of course, the present invention is not limited to a particular arrangement for a bit line equalizer.

In FIGS. 9 and 10, there are shown two pairs of bit lines connected to respective ones of the two equalizer/multiplexers EQ/MUX. There is also shown two pairs of unconnected bit lines disposed adjacent to the bit line pairs which are connected to the equalizer/multiplexers. Thus, the sense amplifier circuit of FIGS. 9 and 10 is a two-sided sense amplifier circuit shared between adjacent cell arrays. Of course, while the invention is described as being used with a memory device having the two-sided sense amplifiers shown in FIGS. 9 and 10, the invention is not limited in this respect and may be used in memory devices having other types of two-sided sense amplifiers or in memory devices having single-sided sense amplifiers.

FIG. 10 shows the master bus switches MDQSW coupled to local data bus LDQ. As noted above, sense amplifier SA includes both the N-type and P-type sense amplifier portions and bit line equalizer circuit BL EQ may include a shunting transistor switch. MOS transistors controlled by signals MUXil and MUXir form the multiplexer that enables the sense amplifier to be shared between two cell arrays. Prior to the transfer of signals, the two complementary wires comprising the local data line are equalized with local data line equalizer LDQ EQ which is arranged in substantially the same manner as the bit line equalizer circuit BL EQ. Master data line switches MDQSW connect the local data lines to the master data lines. Additional details of the layout of a semiconductor memory device in which the present invention may be implemented may be found in U.S. Pat. No. 5,546,349 or U.S. application Ser. No. 09/061,058, the contents of which are incorporated herein by reference.

Figure 11:
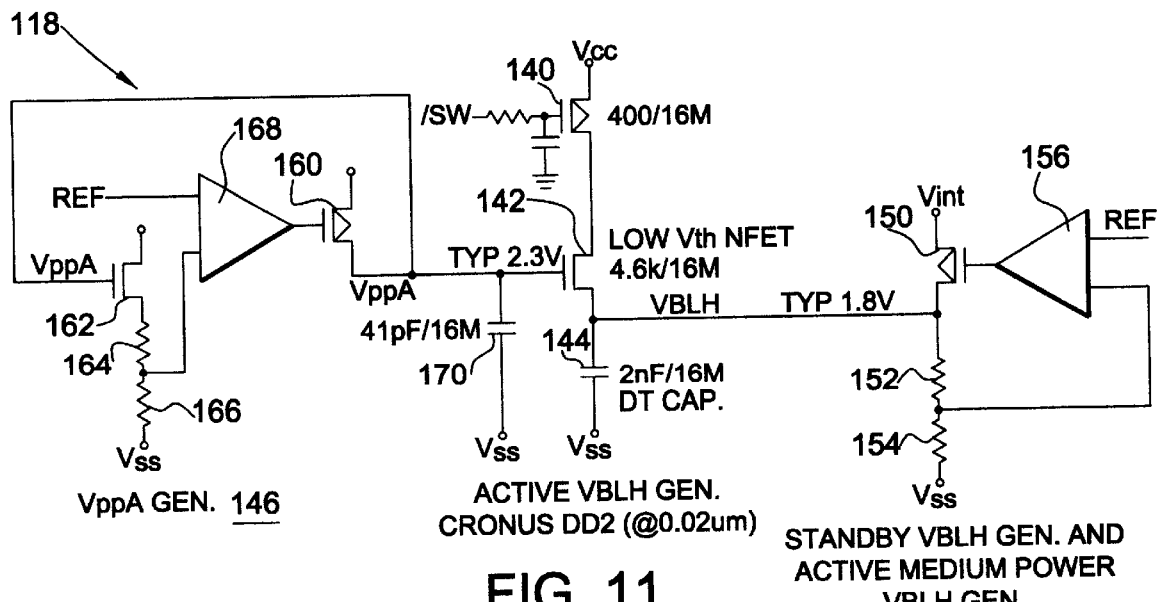
FIG. 11 is a schematic block diagram of the VBLH generator shown in FIG. 8.

FIG. 11 is a schematic block diagram of VBLH generator 118 shown in FIG. 8. VBLH generator 118 includes a P-channel MOS transistor 140, an N-channel MOS transistor 142, and a capacitor 144 connected in series between VCC and VSS. Although not limited in this respect, capacitor 144 may be advantageously provided as a deep trench capacitor as described in co-pending application Ser. No. 09/313,282 entitled "Voltage generator for semiconductor device", the contents of which are incorporated herein. The gate of P-channel MOS transistor 140 is supplied with a switching signal/SW via an RC circuit and the gate of N-channel MOS transistor 142 is supplied with the output of a VppA generator 146. Alternatively, the switching signal/SW may be supplied by any other related source as is well known in the art. VppA generator 146 includes a P-channel MOS transistor 160 having a first end connected to voltage VCC and a second end connected to the gate of N-channel MOS transistor 142. An N-channel MOS transistor 162 has a first end connected to voltage VCC and a gate connected to the second end of P-channel MOS transistor 160. A resistive element 164 has a first end connected to a second end of N-channel MOS transistor 162 and a resistive element 166 has a first end connected to a second end of resistive element 164 and a second end connected to VSS. A comparator 168 has a first input terminal connected to a reference potential and a second input terminal connected to a node between resistive elements 164 and 166. An output of comparator 168 is connected to the gate of P-channel MOS transistor 160. A capacitor 170 is connected between the gate of N-channel MOS transistor 142 and VSS.

The voltage VBLH is derived from a node between N-channel MOS transistor 142 and capacitor 144. A feedback regulator 148 regulates the voltage VBLH and includes a P-channel MOS transistor 150, a resistive element 152, and a resistive element 154 connected in series between VINT and VSS. Feedback regulator 148 further includes a comparator 156 which is supplied at one input terminal with a reference voltage and at the other input terminal with a voltage derived from a node between resistive elements 152 and 154.

FIGS. 12(*a*)–12(*c*) are timing diagrams illustrating the relationship of the switching signal/SW supplied to P-channel MOS transistor 140 to the /RAS clock signal for clocking in a row address supplied to a row address decoder in order to select the word lines connected to the memory cells. With reference to FIG. 12(*a*), when the /RAS clock signal transitions to low level (low level=active level), a PRAS signal is generated. PRAS is generated in response to activation of the /RAS signal. The PRAS signal causes the switch signal/SW to transition to a low level, thereby turning ON P-channel MOS transistor switch 140. The PRAS signal is a type of pulse signal, whose rising edge corresponds to the falling edge of the /RAS signal and whose pulse width may be generated internally. The falling edge of the /SW signal corresponds to the rising edge of the PRAS. The rising edge of the /SW signal may generated by an internal delay timer. P-channel MOS transistor 140 remains ON as long as the switch signal/SW is at low level. The time period that the switch signal/SW remains at low level may be determined by a simple timer or counter circuit which is activated by the PRAS signal. The counter may be controller circuit related to the VBLH generator and may be located inside the VBLH generator 118 of FIG. 8. At the end of the time period determined by the timer or counter circuit, the switch signal/SW returns to high level and P-channel MOS transistor 140 is turned OFF.

FIG. 12(*d*) shows a timing diagram which also shows signal SAP and the relationship of /RAS, PRAS, /SW, VBLH, VppA, and the bit line potentials with a common time reference.

FIG. 12(*b*) illustrates a short cycle case in which the time period between consecutive occurrences of a PRAS pulse is less than the time period determined by the above-described counter or timer circuit. In this case, the switch signal/SW remains at low level and P-channel MOS transistor 140 remains ON. FIG. 12(*c*) illustrates a relaxed case in which the time period between consecutive occurrences of a PRAS pulse is greater than the time period between PRAS pulses shown in FIG. 12(*a*). The cycle is the period between a RAS active and the next RAS active. In the case of the auto precharge condition, the cycle corresponds to the RAS active cycle period. In the case of burst operation conditions, the cycle corresponds to the RAS to RAS bank active cycle periods.

Thus, the relatively large N-channel MOS transistor 142 is enabled during a limited time and supplies most of the current IBLH. At other times, for example, during stand-by, pre-charge, or low frequency operation conditions, the feedback regulator 148 maintains the VBLH level. In one illustrative implementation, the VBLH voltage and the power source of the VBLH generator are 1.8 volts and 3.3 volts respectively. Thus, the voltage drop of the P-channel MOS transistor 140 and the wiring resistance does not affect VBLH characteristics.

Here, the P-channel MOS transistor and wiring resistance cause a voltage drop. This voltage drop affects the drain node voltage of the VBLH NMOS driver. So, if the voltage of the power source for the VBLH generator is close to the voltage VBLH, the voltage drop affects the VBLH voltage. But, if the power source voltage is sufficiently larger than VBLH, then it does not affect the VBLH. The wiring resistance is related in part to the circuit arrangement. Because the VBLH NMOS drivers are placed near the cell array, the drain nodes of the VBLH NMOS driver are far from a connection pad. Accordingly, the resistance between the pad and the power source of the VBLH NMOS driver becomes relatively large. If the disclosed scheme is sensitive to the resultant voltage drop, it may be harmed by the drop caused by the wiring resistance.

The P-channel MOS transistor 140 is turned on before the current peak caused by sense amplifier operation and is turned off after the current peak. As noted above, this switching may be implemented using a simple counter or timer circuit. P-channel MOS transistor 140 and the wiring resistance between the external voltage node and the array voltage node suppress the current peak. Here, the P-channel MOS transistor resistance and the wiring resistance may be viewed as side effects in the present system. However, the arrangement and use of these side effects is used, in part, to reduce internal noise. If the resistance of the P-channel MOS transistor are zero, the turn on of the NMOS driver causes a significant di/dt noise problem. This noise problem is one of the detriments of a conventional NMOS VBLH arrangement. So, here, at least in one aspect, the present system eliminates the noise problem of conventional NMOS VBLH systems through the use of the above-identified "side effects".

The feedback regulator 148 also operates as a bleeder circuit, but current consumption is independent of sub-threshold leakage of the NMOS driver. Most of the current IBLH is supplied by the N-channel MOS transistor 142. Thus, a large current capability of the feedback regulator 148 is not needed and a high response is not needed. The scheme described herein is also useful with other voltages, including VINT. For example, a high speed device needs a high current generator. In this regard, the VINT current requirement is similar to the VBLH requirement and can be met in a similar fashion.

EXAMPLE

Figure 13A:
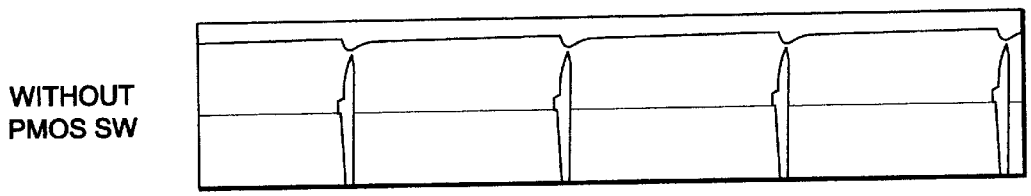
Figure 13A:
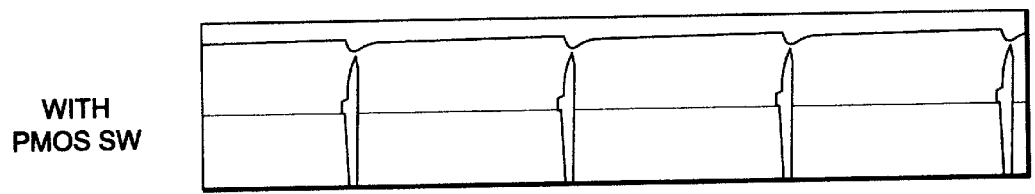
Figure 13A:
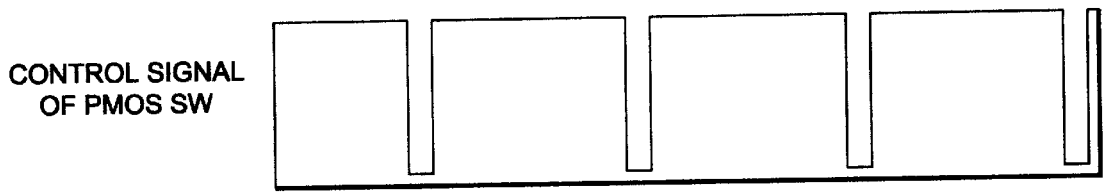
Figure 12A:
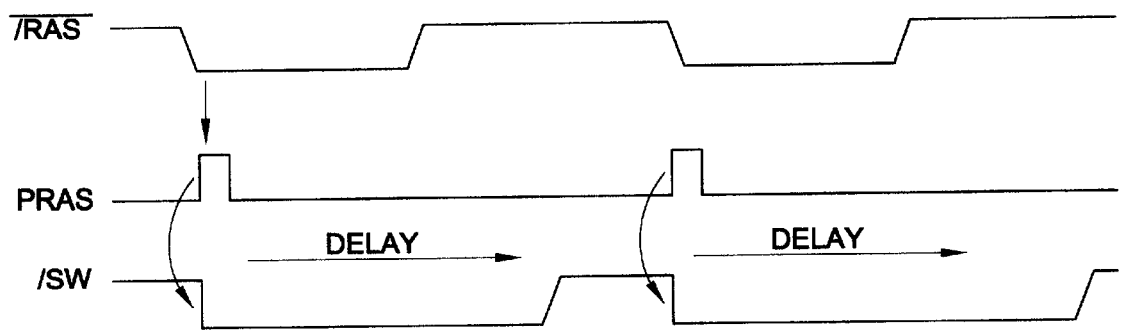
FIGS. 12(a)–12(d) are timing diagrams for the operation of the VBLH generator of FIG. 11.
Figure 12B:
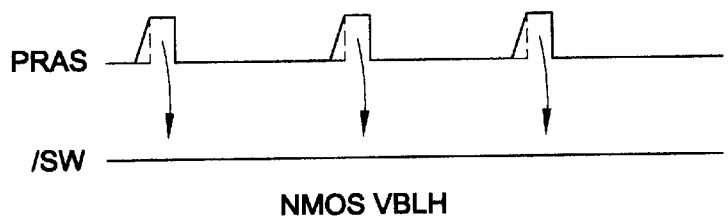
Figure 12C:
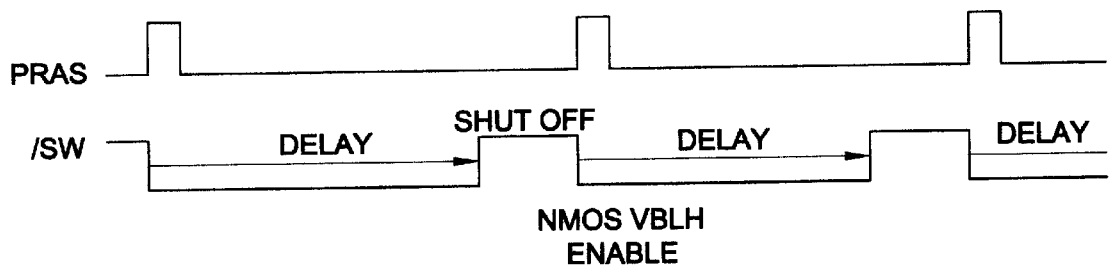
Figure 12D:
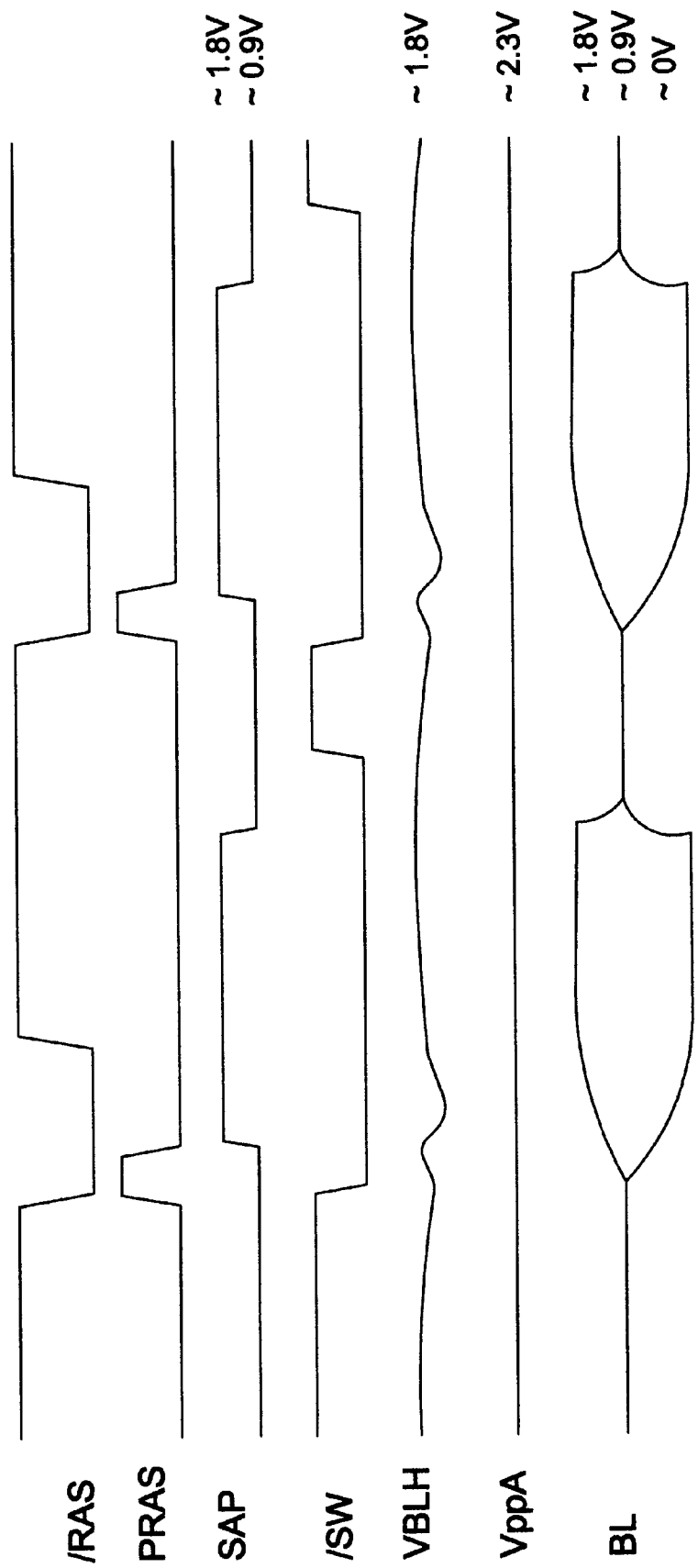

FIGS. 13(a)–13(c) illustrate simulation results which demonstrate the advantages of the present invention. The following table lists various parameters used in the simulation using HSPICE simulation software:

| Parameter | Value |
| --- | --- |
| Total channel width of the NMOS Driver | 64000 um |
| Channel length of the NMOS Driver | 0.36 um |
| Total Capacitance for VBLH | 32 nF |
| Total Capacitance for VppA | 0.6 nF |
| Total Channel Width of the PMOS Switch | 3200 um |
| Channel Length of the PMOS Switch | 0.36 um |
| Vext | 2.8 V |
| Vint | 2.4 V |

FIG. 13(a) shows the levels of VBLH and bit lines BL and /BL (see FIG. 8) when the voltage generator of FIG. 11 does not include P-channel MOS transistor 140; FIG. 13(b) shows the levels of VBLH and bit lines BL and /BL when the voltage generator of FIG. 11 is used; and FIG. 13(c) illustrates the timing of the switching signal/SW supplied to P-channel MOS transistor 140. As can be seen in FIG. 13(a), in the stand-by state, the voltage VBLH is affected by voltage creep; that is, the voltage VBLH slowly increases. With reference to FIG. 13(b), it can be seen that when P-channel MOS transistor 140 is provided and this P-channel MOS transistor is switched OFF during the stand-by state, the voltage VBLH is substantially constant and voltage creep is significantly reduced.

The VBLH voltage generator described above makes the voltage rise due to sub-threshold leakage very small. Thus, voltage creep is significantly reduced and a stable VBLH voltage may be provided. In addition, the waste current becomes smaller (e.g., 5 microamps in standby and 350 microamps in active) than in a conventional bleeder scheme. In addition, an NMOS transistor having a low threshold voltage may be used for the NMOS driver; thus, a non-boosted voltage may be supplied to the gate of the NMOS driver.

While particular embodiments of the present invention have been described and illustrated, it should be understood that the invention is not limited thereto since modifications may be made by persons skilled in the art. The present application contemplates any and all modifications that fall within the spirit and scope of the underlying invention discloses and claimed herein.

We claim:

1. A voltage generator for generating an output voltage at an output terminal thereof, comprising:
    a first transistor of a first channel conductivity type having a first end connected to said output terminal;
    a feedback regulator connected to said output terminal;
    a switch connected between a first voltage node and a second end of said first transistor, said switch receiving a switching signal.

2. The voltage generator according to claim 1, wherein said switch comprises a second transistor of a second channel conductivity type having a first end connected to said first voltage node, a second end connected to said second end of said first transistor, and a gate which receives the switching signal.

3. The voltage generator according to claim 1, further comprising:
    a circuit for generating the switching signal such that said switching element is switched OFF when said first transistor is OFF and said switch is switched ON when said first transistor is ON.

4. The voltage generator according to claim 1, further comprising:

a voltage generating circuit which is supplied with a reference voltage and generates a voltage supplied to a gate of said first transistor.

5. The voltage generator according to claim 1, wherein said voltage generator comprises:

a second transistor of a second channel conductivity type having a first end connected to a second voltage node and a second end connected to a gate of said first transistor;

a third transistor of the first channel conductivity type having a first end connected to a third voltage node and a gate connected to said second end of said second transistor;

a first resistive element having a first end connected to a second end of said third transistor;

a second resistive element having a first end connected to a second end of said first resistive element and a second end connected to a fourth voltage node;

a comparator having a first input terminal connected to a reference potential and a second input terminal connected to a node between said first and second resistive elements, an output of said comparator connected to a gate of said second transistor; and a capacitor connected between said gate of said first transistor and said fourth voltage node.

6. The semiconductor memory device according to claim 1, wherein said feedback regulator comprises:

a second transistor of a second channel conductivity type having a first end connected to said output terminal and a second end connected to a second voltage node;

a first resistive element having a first end connected to said output terminal;

a second resistive element having a first end connected to a second end of said first resistive element and a second end connected to a third voltage node; and a comparator having a first terminal connected to a reference voltage and a second terminal connected to a node between said first and second resistive elements, an output terminal of said comparator connected to a gate of said second transistor.

7. A semiconductor memory device comprising:

memory cells connected to bit lines;

sense amplifiers for amplifying potential differences on said bit lines;

a voltage generator for generating a voltage at an output terminal thereof which is supplied to said sense amplifiers, said voltage generator comprising:

a first transistor of a first channel conductivity type having a first end connected to said output terminal;

a feedback regulator connected to said output terminal; and a switch connected between a first voltage node and a second end of said first transistor, said switch receiving a switching signal.

8. The semiconductor memory device according to claim 7, wherein said feedback regulator comprises:

a second transistor of a second channel conductivity type having a first end connected to said output terminal and a second end connected to a second voltage node;

a first resistive element having a first end connected to said output terminal;

a second resistive element having a first end connected to a second end of said first resistive element and a second end connected to a third voltage node; and a comparator having a first terminal connected to a reference voltage and a second terminal connected to a node between said first and second resistive elements, an output terminal of said comparator connected to a gate of said second transistor.

9. The semiconductor memory device according to claim 7, wherein said memory cells each comprise a trench capacitor and a switching transistor.

10. The semiconductor memory device according to claim 7, wherein said switch comprises a second transistor of a second channel conductivity type having a first end connected to said first voltage node, a second end connected to said second end of said first transistor, and a gate which receives the switching signal.

11. The semiconductor memory device according to claim 7, further comprising:

a circuit for generating the switching signal such that said switch is switched OFF when said first transistor is OFF and said switch is switched ON when said first transistor is ON.

12. The semiconductor memory device according to claim 7, further comprising:

a voltage generating circuit which is supplied with a reference voltage and generates a voltage supplied to a gate of said first transistor.

* * * * *